US006818961B1

(12) United States Patent
Rizzo et al.

(10) Patent No.: US 6,818,961 B1
(45) Date of Patent: Nov. 16, 2004

(54) OBLIQUE DEPOSITION TO INDUCE MAGNETIC ANISOTROPY FOR MRAM CELLS

(75) Inventors: Nicholas D. Rizzo, Gilbert, AZ (US); Bradley N. Engel, Chandler, AZ (US); Jason A. Janesky, Mesa, AZ (US); Jon M. Slaughter, Tempe, AZ (US); Jijun Sun, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/611,789

(22) Filed: Jun. 30, 2003

(51) Int. Cl.$^7$ .......................... H01L 29/82; H01L 43/00
(52) U.S. Cl. ...................... 257/422; 257/421; 365/157; 365/158; 365/171; 365/173; 438/3
(58) Field of Search .................. 257/421, 422, 257/425, 426, 427; 365/171, 173, 157, 158; 438/3

(56) References Cited

U.S. PATENT DOCUMENTS

| 6,396,735 B2 | * | 5/2002 | Michijima et al. ........ 365/173 |
| 2002/0036331 A1 | * | 3/2002 | Nickel et al. ............. 257/421 |
| 2004/0021190 A1 | * | 2/2004 | Mattson ................... 257/421 |

* cited by examiner

Primary Examiner—Ngân V. Ngô
(74) Attorney, Agent, or Firm—Ingrassia Fisher & Lorenz PC

(57) ABSTRACT

A method of fabricating a magnetoresistive tunneling junction cell comprising the steps of providing a substrate with a surface, depositing a first magnetic region (17) having a resultant magnetic moment vector onto the substrate, depositing an electrically insulating material (16) onto the first magnetic region, and depositing a second magnetic region (15) onto the electrically insulating material, wherein at least a portion of one of the first and second magnetic regions is formed by depositing said region at a nonzero deposition angle relative to a direction perpendicular to the surface of the substrate to create an induced anisotropy.

48 Claims, 3 Drawing Sheets

OBLIQUE DEPOSITION TO INDUCE MAGNETIC ANISOTROPY FOR MRAM CELLS

FIELD OF THE INVENTION

This invention relates to semiconductor memory devices and, more particularly, the present invention relates to devices that utilize magnetic thin films

BACKGROUND OF THE INVENTION

Memory devices are an extremely important component in electronic systems. The three most important commercial high-density memory technologies are SRAM, DRAM, and FLASH. Each of these memory devices uses an electronic charge to store information and each has its own advantages. For example, SRAM has fast read and write speeds, but it is volatile and requires a large cell area. DRAM has a high memory density, but it is also volatile and requires a refresh of the storage capacitor every few milliseconds. This refresh requirement increases the complexity of the control electronics.

FLASH is the major nonvolatile memory device in use today. Typical FLASH memory devices use charges trapped in a floating oxide layer to store information. Drawbacks to FLASH include high voltage requirements and slow program and erase times. Also, FLASH memory has a poor write endurance of about $10^4$–$10^6$ cycles before memory failure. In addition, to maintain reasonable data retention, the thickness of the gate oxide has to stay above the threshold that allows electron tunneling. This thickness requirement severely restricts the scaling trends of FLASH memory.

To overcome these shortcomings, magnetic memory devices are being evaluated. One such device is magnetoresistive random access memory (hereinafter referred to as "MRAM"). MRAM has the potential to have a speed performance similar to DRAM. To be commercially viable, however, MRAM should have comparable memory density to current memory technologies, be scalable for future generations, operate at low voltages, have low power consumption, and have competitive read/write speeds.

For an MRAM device, the stability of the memory state, the repeatability of the read/write cycles, and the power consumption are some of the more important aspects of its design characteristics. A memory state in MRAM is not maintained by power, but rather by the direction of a magnetic moment vector. In typical MRAM devices, storing data is accomplished by applying magnetic fields and causing a magnetic material in an MRAM cell to be magnetized into either of two possible memory states. Recalling data is accomplished by sensing the resistive state of the cell which depends on the magnetic state. The magnetic fields are created by passing currents through strip lines external to the magnetic structure or through the magnetic structures themselves.

For standard MRAM devices, the switching field $H_{sw}$ is proportional to the total anisotropy $H_{k\_total}$ of the bit, which can include contributions from the device shape and material composition. Most MRAM devices rely on a bit shape having an aspect ratio greater than unity to create a shape anisotropy $H_{k\_shape}$ that provides the switching field $H_{sw}$.

However, there are several drawbacks to relying on $H_{k\_shape}$ to provide $H_{sw}$. First, $H_{k\_shape}$ increases as the bit dimension shrinks so that $H_{sw}$ increases for a given shape and film thickness. A bit with larger $H_{sw}$ requires more current to switch. Second, variations in $H_{sw}$ will occur due to variations in bit shape from lithographic patterning and etching. These variations will increase as the bit size shrinks due to the finite resolution of optical lithography and etch processes. Variations in $H_{sw}$ translate into a smaller operating window for programming of the bits and are therefore undesirable. Third, the range over which the magnitude of $H_{k\_shape}$ can be varied is limited. Only certain bit shapes produce reliable switching and although varying the thickness of the film will vary $H_{k\_shape}$, there is a maximum bit thickness above which the bit switching quality degrades due to domain formation.

Other MRAM devices rely on anisotropy from pair ordering of like atoms to provide all or part of $H_{k\_total}$. For example, if a nickel iron (NiFe) film is deposited in a magnetic field, a small percentage of the iron (Fe) and nickel (Ni) atoms pair with like atoms and form chains parallel to the magnetic field, providing a pair anisotropy of approximately 5 Oe substantially parallel to the magnetic field direction.

Pair ordering anisotropy $H_{k\_pair}$ has the advantage of being substantially independent of bit shape and is relatively unchanged as the bit size decreases. However, the magnitude and direction of $H_{kpair}$ can drift with temperature. This temperature drift substantially results from thermal diffusion of the atom pairs. In addition, the magnitude of $H_{kpair}$ is predominately fixed for a particular magnetic material which limits the range of $H_{sw}$.

Based on the limitations of shape and pair anisotropy discussed above, it is clear that a need exists to adjust the switching magnetic field $H_{sw}$ using a magnetic anisotropy which is adjustable over a wide range, does not substantially depend on bit shape, and is thermally stable. Accordingly, it is an object of the present invention to provide a new and improved method of fabricating a magnetoresistive random access memory device.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
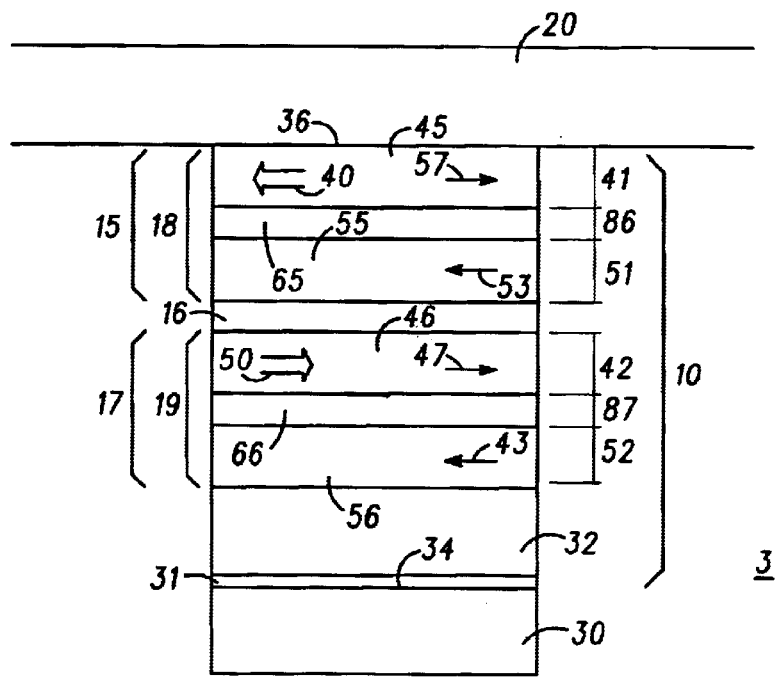
FIG. 1 is a sectional view of a magnetoresistive random access memory device in accordance with the present invention.

Turn now to FIG. 1, which illustrates a simplified sectional view of an MRAM array 3 in accordance with the present invention. In this illustration, only a single MRAM device 10 is shown, but it will be understood that MRAM array 3 generally includes a number of MRAM devices. However, we are showing only one such device for simplicity and ease of discussion to illustrate a method of depositing a material layer at an oblique angle to induce a magnetic anisotropy. Also, while MRAM devices are discussed and magnetic tunnel junction (MTJ) devices specifically, it will be understood that other magnetoelectronic devices (e.g. GMR devices, magnetic sensors, etc.) can be produced using similar techniques.

In a preferred embodiment, MRAM device 10 is sandwiched therebetween a bit line 20 and a digit line 30. Bit line 20 and digit line 30 include conductive material such that a current can be passed therethrough. In this illustration, bit line 20 is positioned on a surface 36 of MRAM device 10 and digit line 30 is positioned on a surface 34 of MRAM device 10 wherein digit line 30 is oriented approximately at a 90° angle relative to bit line 20 (See FIG. 2). However, it will be understood that the positioning of bit line 20 and digit line 30 is for illustrative purposes only wherein many other configurations are possible.

Figure 2:
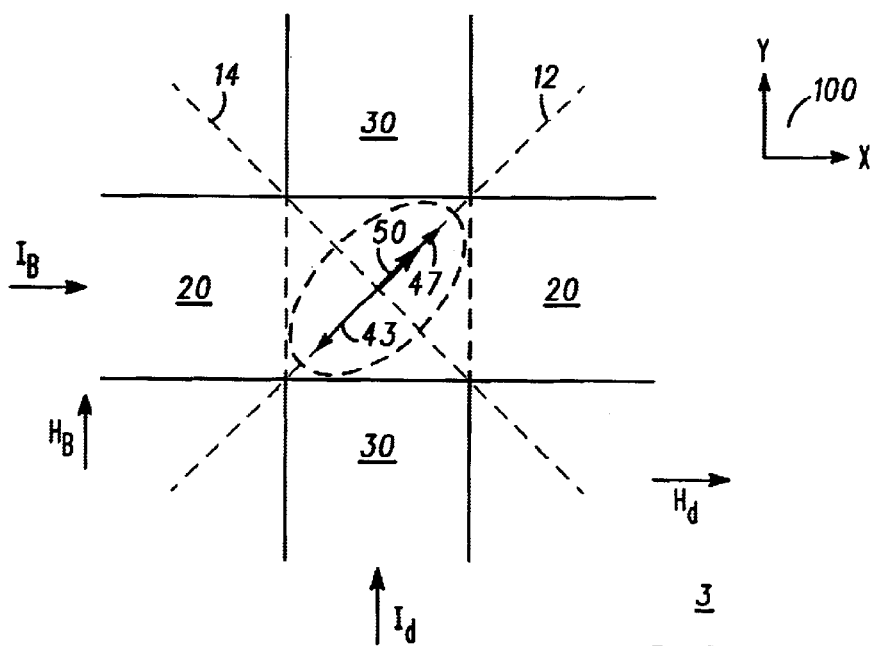
FIG. 2 is a simplified plan view of a magnetoresistive random access memory device in accordance with the present invention.

Turn now to FIG. 2 which illustrates a simplified plan view of MRAM array 3 in accordance with the present invention. To simplify the description of MRAM device 10, all directions will be referenced to an x- and y-coordinate system 100 as shown. The purpose of bit line 20 and digit line 30 is to create a magnetic field within MRAM device 10. A positive bit current (i.e. a bit current flowing in the positive x-direction), $I_B$, will produce a circumferential bit magnetic field, $H_B$, and a positive digit current (i.e. a digit current flowing in the positive y-direction), $I_D$, will produce a circumferential digit magnetic field, $H_D$.

Since bit line 20 is above MRAM device 10, in the plane of the element, $H_B$ will be applied to MRAM device 10 in the positive y-direction for positive $I_B$. Similarly, since digit line 30 is below MRAM device 10, in the plane of the element, $H_D$ will be applied to MRAM device 10 in the positive x-direction for positive $I_D$. The behavior of a current produced magnetic field is well known to those skilled in the art and will not be elaborated upon further here.

Turning back to FIG. 1, MRAM device 10 includes a tunneling barrier 16 sandwiched therebetween a magnetic region 15 and a magnet region 17, wherein a portion of MRAM device 10 is deposited at a nonzero deposition angle, θ, as will be discussed separately with FIG. 3. In the preferred embodiment, tunneling barrier 16 can include an electrically insulating material, such as aluminum oxide, or the like to form a tunneling junction.

Also in the preferred embodiment, magnetic region 15 includes a tri-layer structure 18, which has an anti-ferromagnetic coupling spacer layer 65 sandwiched therebetween a ferromagnetic layer 45 and a ferromagnetic layer 55. Further, in the preferred embodiment, magnetic region 17 has a tri-layer structure 19, which includes an anti-ferromagnetic coupling spacer layer 66 sandwiched therebetween a ferromagnetic layer 46 and a ferromagnetic layer 56.

It will be understood that magnetic regions 15 and 17 can include N ferromagnetic layers wherein N is a whole number greater than or equal to two. However, in the preferred embodiment, N is equal to two so that magnetic regions 15 and 17 each include one tri-layer structure 18 and 19, respectively. It should be understood that tri-layer structures are often referred to as synthetic anti-ferromagnetic (hereinafter referred to as "SAF") structures.

Also, it will be understood that magnetic regions 15 and 17 can include SAF layer material structures other than tri-layer structures and the use of tri-layer structures in this embodiment is for illustrative purposes only. For example, one such SAF layer material structure could include a five-layer stack of a ferromagnetic layer/ anti-ferromagnetic coupling spacer layer/ferromagnetic layer/anti-ferromagnetic coupling spacer layer/ferromagnetic layer structure. Also, magnetic regions 15 and 17 can include other magnetic material structures which produce a magnetic moment vector, such as a single magnetic layer.

Generally, anti-ferromagnetic coupling spacer layers 65 and 66 include at least one of the elements ruthenium (Ru), rhenium (Re), osmium (Os), titanium (Ti), chromium (Cr), rhodium (Rh), platinum (Pt), copper (Cu), palladium (Pd), or alloys thereof. Further, ferromagnetic layers 45, 55, 46, and 56 generally include at least one of elements nickel (Ni), iron (Fe), cobalt (Co), or alloys thereof. In the preferred embodiment, ferromagnetic layers 45 and 55 each have a magnetic moment vector 57 and 53, respectively, that are usually held anti-parallel by the coupling of anti-ferromagnetic coupling spacer layer 65. Further, ferromagnetic layers 46 and 56 each have a magnetic moment vector 47 and 43, respectively, that are usually held anti-parallel by the coupling of anti-ferromagnetic coupling spacer layer 66. Also, magnetic region 15 has a resultant magnetic moment vector 40 and magnetic region 17 has a resultant magnetic moment vector 50.

It will be understood that resultant magnetic moment vector 40 is the vector sum of magnetic moment vectors 53 and 57 and resultant magnetic moment vector 50 is the vector sum of magnetic moment vectors 43 and 47. In the case of a balanced magnetic moment between layers 45 and 55, resultant magnetic moment vector 40 is approximately zero. However, the magnetoresistance is still determined by the magnetic moment vectors (i.e. magnetic moment vectors 47 and 53) adjacent to tunneling barrier 16.

In the preferred embodiment, resultant magnetic moment vectors 40 and 50 are oriented substantially along an anisotropy easy axis 12 (See FIG. 2) in a preferred direction that is at an angle, preferably 45°, from bit line 20 and digit line 30 (See FIG. 2): Easy axis 12 is also oriented approximately 90° from an anisotropy hard axis 14 (See FIG. 2). Further, magnetic region 15 is a free magnetic region, meaning that resultant magnetic moment vector 40 is free to rotate in the presence of an applied magnetic field. Magnetic region 17 is a pinned magnetic region, meaning that resultant magnetic moment vector 50 is generally not free to rotate in the presence of an applied magnetic field and is used as a reference.

In the preferred embodiment, resultant magnetic moment vector 50 is substantially pinned due to an anti-ferromagnetic coupling between magnetic region 17 and an anti-ferromagnetic region 32 which includes a seed layer 31. It will be understood, however, that the formation of magnetic regions 15 and 17 as the free and pinned magnetic regions, respectively, is for illustrative purposes only and that other configurations are possible. For example, magnetic region 15 could be formed as the pinned magnetic region and magnetic region 17 could be formed as the free magnetic region.

MRAM device 10 is capable of flowing a tunneling current therethrough tunneling barrier 16. The tunneling current substantially depends on a tunneling magnetoresistance of MRAM device 10, which is governed by the relative orientation of magnetic moment vectors 53 and 47 adjacent to tunneling barrier 16. If magnetic moment vectors 53 and 47 are substantially parallel, then MRAM device 10 has a low resistance and a voltage bias therebetween bit line 20 and digit line 30 will create a larger tunneling current through MRAM device 10. This state is defined as a "1".

If magnetic moment vectors 53 and 47 are substantially anti-parallel, then MRAM device 10 will have a high resistance and an applied voltage bias therebetween bit line 20 and digit line 30 will create a smaller current therethrough MRAM device 10. This state is defined as a "0".

It will be understood, however, that these definitions are arbitrary and could be reversed, but are used in this example for illustrative purposes. Thus, in typical magnetoresistive memory, data storage is accomplished by applying magnetic fields that cause the magnetic moment vectors in the free ferromagnetic region to be orientated in either one of parallel and anti-parallel directions relative to the magnetic moment vector in the pinned ferromagnetic region.

While anti-ferromagnetic coupling layer 65 is illustrated between ferromagnetic layers 45 and 55 in tri-layer structure 18, it will be understood that ferromagnetic layers 45 and 55 could be anti-ferromagnetically coupled through other means, such as magnetic fields or other features. For example, when the aspect ratio of an MRAM cell is reduced to five or less, the ferromagnetic layers are substantially coupled anti-parallel from magnetic flux closure.

In the preferred embodiment, MRAM device 10 has tri-layer structures 18 and 19 that have a length/width ratio in a range of one to five for a non-circular plan. We illustrate a plan with an aspect ratio equal to two (See FIG. 2). MRAM device 10 is elliptical in shape in the preferred embodiment to minimize the contribution to switching field variations from shape anisotropy and also because it is easier to use photolithographic processing to scale the device to smaller dimensions laterally. However, it will be understood that MRAM device 10 can have other shapes, such as circular, square, rectangular, diamond, or the like, but is illustrated as being elliptical for simplicity and improved performance.

Further, during fabrication of MRAM array 3, each succeeding layer (i.e. 30, 31, 32, 56, etc.) is deposited or otherwise formed in sequence and each MRAM device 10 may be defined by selective deposition, photolithography processing, etching, etc. in any of the techniques well known to those skilled in the art.

Figure 3:
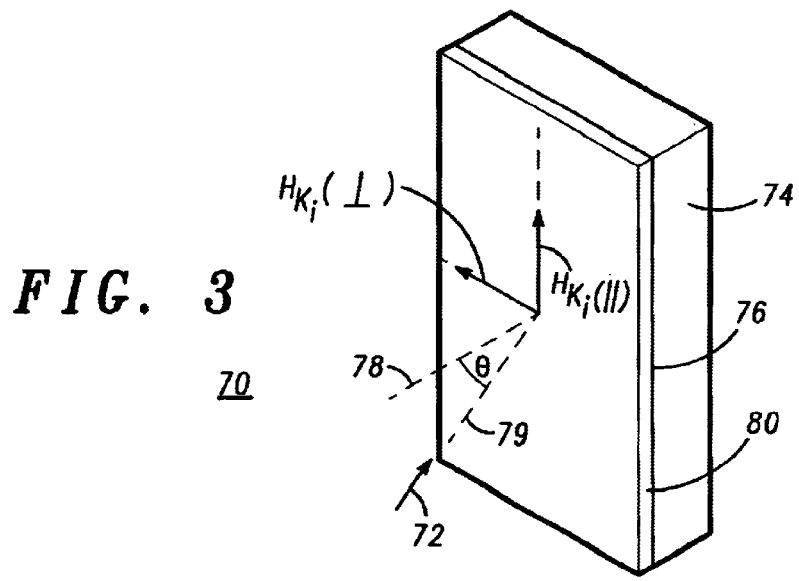
FIG. 3 is an oblique view of a substrate with a material layer being deposited at a nonzero deposition angle.

As mentioned previously, a portion of MRAM device 10 is deposited at the nonzero deposition angle, θ, as shown in FIG. 3 where a substrate 74 with a surface 76 is illustrated. A material flux 72 is incident to surface 76 at the angle θ relative to a reference line 78 oriented perpendicular to surface 76. Material flux 72 forms a material region 80 positioned on surface 76. Material region 80 typically has an induced uniaxial magnetic anisotropy, $H_{ki}$, substantially oriented parallel, $H_{ki}(\parallel)$, or perpendicular, $H_{ki}(\perp)$, to a plane of incidence and parallel to surface 76. The plane of incidence is defined by reference line 78 and a reference line 79 oriented parallel to material flux 72. Further, it will be understood that material flux 72 can include magnetic or non-magnetic materials. In the preferred embodiment, the direction of the induced magnetic anisotropy of material region 80 substantially depends on θ, as will be discussed presently.

Atoms deposited by vapor deposition techniques such as evaporation, physical vapor deposition, or ion-beam deposition have a distribution of deposition angles that is dependent on the details of the deposition process. The deposition angle θ is defined as the average deposition angle for the flux of atoms that deposit on the wafer to form the layer. To achieve an average angle of zero, the atoms can be directly deposited at normal incidence or the flux of atoms can have deposition angle θ and the wafer can be rotated during the deposition to produce an average angle of zero.

Figure 4:
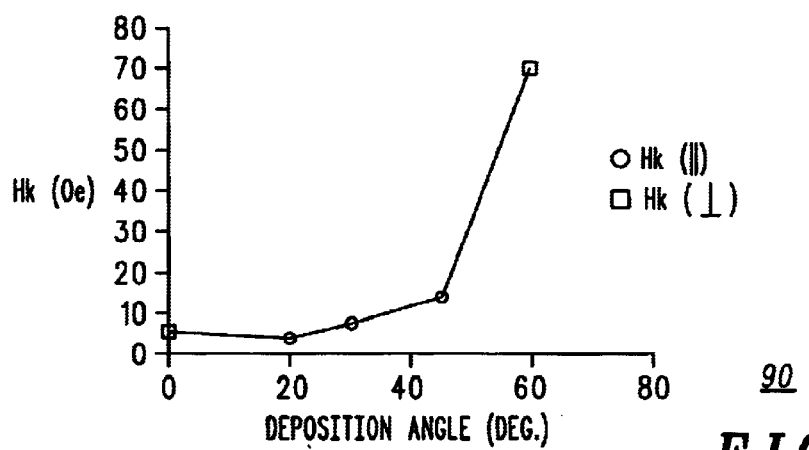
FIG. 4 is a graph illustrating a magnitude of an induced anisotropy verses a deposition angle for a 25 nm nickel iron (NiFe) layer.

Turn now to FIG. 4 which illustrates a graph 90 of the magnitude of the induced magnetic anisotropy, $H_{ki}$, verses θ when material region 80 includes a 25 nm nickel-iron alloy (NiFe) layer. In graph 90, circles designate $H_{ki}(\parallel)$ and squares designate $H_{ki}(\perp)$, where parallel($\parallel$) and perpendicular ($\perp$) refer to the anisotropy axis being parallel or perpendicular to the plane of incidence of the average deposition flux direction and in the plane of the substrate. The magnitude of the induced magnetic anisotropy increases with θ from approximately 5 Oe at θ equal to 20° to approximately 70 Oe at θ equal to 60°. The direction of the pair-ordering anisotropy is set by an applied magnetic field during deposition, giving rise to a small $H_{ki}(\parallel)$ at θ equal to 0°. For intermediate angles the induced anisotropy is parallel and overcomes the small pair-ordering anisotropy to result in a material with significant $H_{ki}(\parallel)$. For the larger deposition angles the induced anisotropy becomes perpendicular and adds substantially to the pair-ordering anisotropy.

Figure 5:
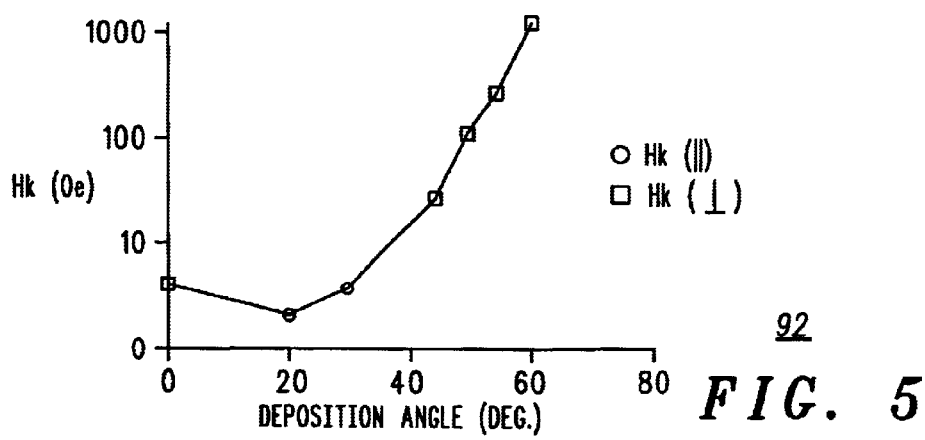
FIG. 5 is a graph illustrating a magnitude of an induced anisotropy verses a deposition angle for a 25 nm nickel iron (NiFe) layer deposited on a 25 nm tantalum (Ta) layer.

Turn now to FIG. 5 which illustrates a graph 92 of the magnitude of the induced magnetic anisotropy verses θ for the 25 nm nickel iron (NiFe) layer positioned on a 25 nm tantalum (Ta) layer also deposited at angle θ. Plotted in graph 92 is $H_{ki}(\perp)$ and $H_{ki}(\parallel)$ wherein the magnitude of the induced magnetic anisotropy increases with θ as shown. As mentioned previously, the magnitude of $H_k$ varies over a substantial range wherein the width of the range generally increases with the number of layers deposited at an oblique angle. In this example, $H_{ki}$ varies over a range given approximately by 5 Oe to 500 Oe when θ is varied from approximately 20° to 60°, respectively, wherein the upper limit of this range (i.e. 500 Oe) is substantially greater than the upper limit (i.e. 70 Oe) for the 25 nm nickel iron (NiFe) layer discussed in FIG. 4. Thus, from FIGS. 4 and 5, it is evident that $H_{ki}$ can be varied over a wide range for substantially the same material composition.

In the preferred embodiment, the origin of $H_{ki}(\parallel)$ and $H_{ki}(\perp)$ for nickel iron (NiFe) films is substantially a result of the oblique deposition angle inducing a surface topography of a film that results in an induced anisotropy $H_{ki}$. For a small θ, grains within the film become substantially elongated parallel to the plane of incidence due to the deposition velocity in a direction parallel to the plane of incidence. This elongation produces a micro-shape anisotropy parallel (i.e. $H_{ki}(\parallel)$) to the plane of incidence. For a larger θ, self-shadowing from the surface roughness produces a corrugation of the film surface substantially perpendicular to the plane of incidence. This produces an induced anisotropy substantially perpendicular (i.e. $H_{ki}(\perp)$) to the plane of incidence. At an intermediate θ, $H_{ki}(\perp)$ and $H_{ki}(\parallel)$ are substantially comparable in magnitude and orthogonal in direction.

For orthogonal anisotropies, the net anisotropy has a magnitude given by the difference between the two anisotropies and a direction defined by the larger anisotropy. Thus, the total anisotropy for the films in FIG. 4 and FIG. 5 is approximately $$H_{k\_total}(\theta) = H_{k\_pair} - H_{ki}(\parallel) + H_{ki}(\perp).$$

In FIG. 4, $H_{k\_pair}$ is deposited to be substantially perpendicular to the plane of incidence. As θ increases, $H_{ki}(\parallel)$ increases quickly so that $H_{k\_total}$ becomes negative. As θ increases further, $H_{ki}(\perp)$ dominates and $H_{k\_total}$ again becomes positive. The net result is that there are two points where $H_{k\_total}$ is zero or quite small due to the cancellation of the various anisotropies.

A similar trend is observed in FIG. 5, except that now the magnitude of $H_{ki}$ for a large θ is significantly increased. This increase is caused by the surface corrugation of the tantalum (Ta) layer so that $H_{ki}(\perp)$ is even larger than for nickel-iron (NiFe) alone.

While nickel-iron (NiFe) films display both a $H_{ki}(\|)$ and $H_{ki}(\perp)$ as a function of θ, some materials do not substantially display a significant $H_{ki}(\|)$ but rather only display a significant $H_{ki}(\perp)$. It will be understood, however, that in the preferred embodiment we discuss the case of nickel-iron (NiFe) for illustrative purposes and ease of discussion.

Figure 8:
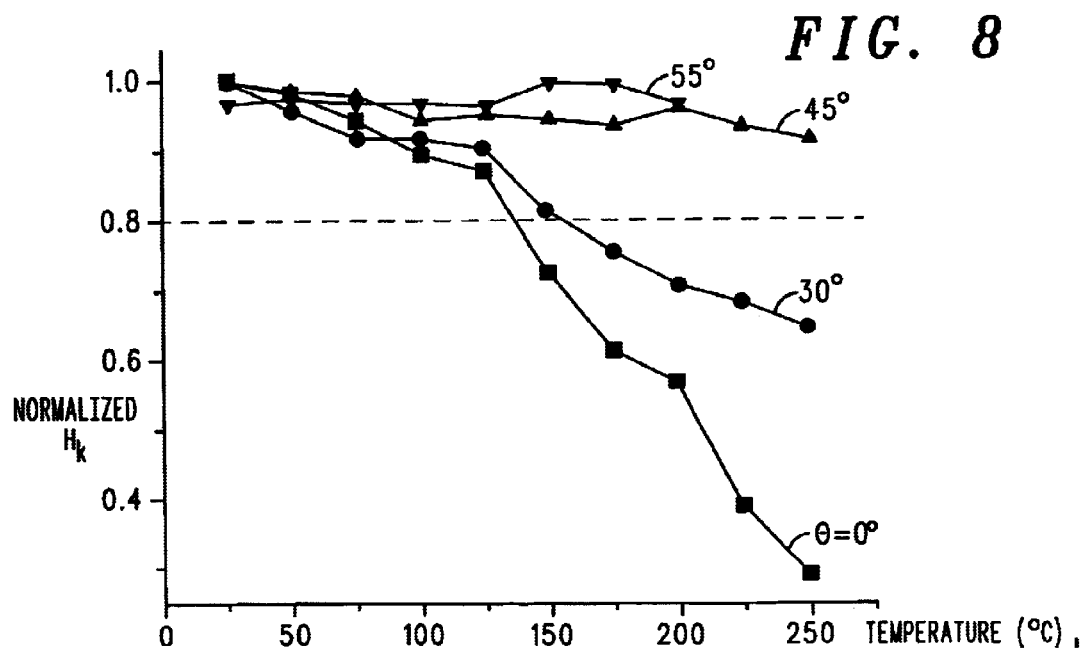
FIG. 8 is a graph illustrating a normalized magnetic anisotropy $H_k$ verses anneal temperature for a bulk nickel iron cobalt (NiFeCo) film deposited on a tantalum (Ta) layer.

Turn now to FIG. 8 which illustrates an experimental measurement of a normalized magnetic anisotropy $H_{k\_total}$ vs. anneal temperature for a bulk nickel iron cobalt (NiFeCo) film deposited on a tantalum (Ta) layer at various deposition angles θ. Since the induced magnetic anisotropy resulting from a nonzero deposition angle is a result of surface topography either from the magnetic material layer itself or from the tantalum layer (See FIG. 5), the magnitude and direction of $H_k$ is substantially stable with temperature so that a thermal drift is minimized. Further, an $H_k$ of a film deposited at an oblique deposition angle does not significantly depend on the bit shape.

Turning back to FIG. 8, the experiment consists of applying a magnetic field transverse to the total anisotropy direction while the film is annealed at each temperature for approximately 15 minutes. For the film with pair ordering anisotropy only (θ=0°), the measured $H_{k\_total}$ drops significantly with increasing temperature due to thermal diffusion of the like pairs of atoms. As θ increases, the induced anisotropy $H_{ki}$ is due primarily to surface topography from an angled deposition, so that the change in anisotropy after anneal is minimized. A thermally stable anisotropy is advantageous for an MRAM cell because the repeated application of magnetic fields for switching will not significantly alter the switching field of a memory cell with such a stable anisotropy.

Therefore, a nonzero deposition angle, θ, can be chosen to obtain the desired anisotropy magnitude and direction for MRAM device 10. The total anisotropy for a magnetic layer in device 10 will be approximately $$H_{k\_total}=H_{k\_shape} \pm H_{k\_pair} \pm H_{ki}(\perp) \pm H_{ki}(\|)$$

Thus, by choosing an appropriate deposition angle for a given magnetic layer or underlayer, $H_{ki}$ can be used to vary $H_{k\_total}$.

Referring back to FIG. 1, it will be understood that there are several other embodiments of memory device 10 that include at least one layer deposited at a nonzero deposition angle θ. In a first embodiment, the free layer (i.e. magnetic region 15) can have at least one layer (i.e. layers 55, 65, and/or 45) deposited at a nonzero deposition angle θ. In this embodiment, the induced anisotropy $H_{ki}$ will add or subtract to the other anisotropies (i.e. $H_{k\_shape}$ or $H_{k\_pair}$) for magnetic region 15. This will substantially depend on whether $H_{ki}(\|)$ or $H_{ki}(\perp)$ is induced and also on the orientation of the other anisotropies.

In the first embodiment, the deposition angle θ is small which has the advantage of maintaining uniform film thickness across the wafer. It will be understood that the uniformity could also be improved by depositing approximately one-half the material of a given layer and then rotating the wafer 180° and completing the deposition. The rotation would mitigate the effects of a thickness gradient due to the angled deposition.

In a second embodiment, MRAM device 10 has a substantially circular shape so that the shape anisotropy is minimized. In addition, the magnetic material can be chosen to have a small $H_{k\_pair}$ so that $H_{ki}$ is the dominant magnetic anisotropy.

In a third embodiment, seed layer 31 can be deposited at nonzero θ while the subsequent layers are deposited at θ approximately equal to 0°. This embodiment has the advantage of maintaining uniform film thickness across the wafer while still obtaining a substantial $H_{ki}$ from seed layer 31.

In a fourth embodiment, magnetic region 17 includes the free layer and magnetic region 15 includes the pinned and fixed layer (an alternative embodiment could have the free layer in magnetic region 15 and the pinned and fixed layer in magnetic region 17). In magnetic region 15, at least one layer (i.e layers 55, 65, and/or 45) can be deposited at nonzero deposition angle θ. In the fourth embodiment, only magnetic region 15 is deposited obliquely at a large angle θ to induce a large $H_{ki}$ in the pinned and fixed layers. A large $H_k$ is desirable for the pinned and fixed layers so that the magnetization direction will be held substantially fixed during writing and reading of memory device 10. This will substantially minimize any disturbance from the movement of the magnetization direction in the pinned and fixed layers.

It will be understood that device 10 can be deposited using an ion beam deposition system, a physical vapor deposition system, or the like, wherein, in the preferred embodiment, the portion of device 10 deposited at a nonzero deposition angle is performed with the substrate static (non-rotating). To produce a large induced $H_{ki}$ it is desirable to produce a relatively collimated beam of incident flux material. A collimated beam can usually be produced within low pressure deposition systems or systems that have long target to substrate distances.

Figure 6:
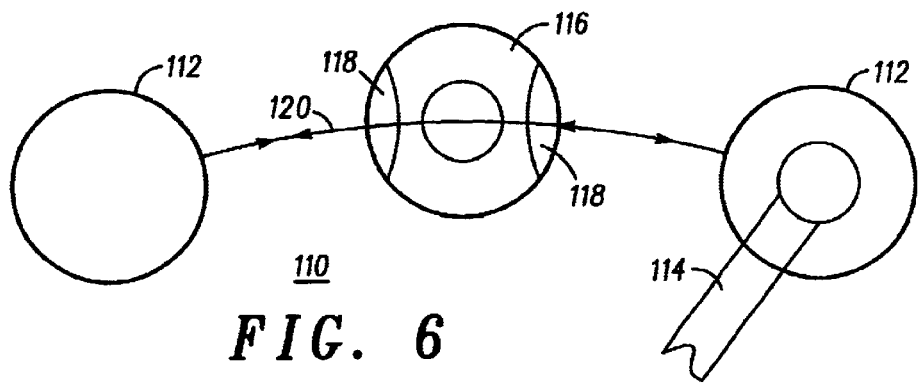
FIG. 6 is a top view a physical vapor deposition system used to deposit material layers in accordance with the present invention.

For an ion beam deposition system, the substrate is oriented at an oblique angle relative to a line drawn from the center of the beam spot on the sputtering target to the center of the substrate. However, for a physical vapor deposition system 110, the substrate can be swept across the sputtering target, as illustrated in FIG. 6, wherein θ varies as a function of time. In the preferred embodiment, physical vapor deposition system 110 includes a shaped target 116 and flux shapers 118. A substrate 112 is generally held by a rotating table or arm 114 which receives substrate 112 from a transfer robot (not shown) through a gate valve (not shown). The basic setup of a deposition system and the operation of a rotating table or arm in such a system is well known to those skilled in the art and will not be elaborated upon further here.

Figure 7:
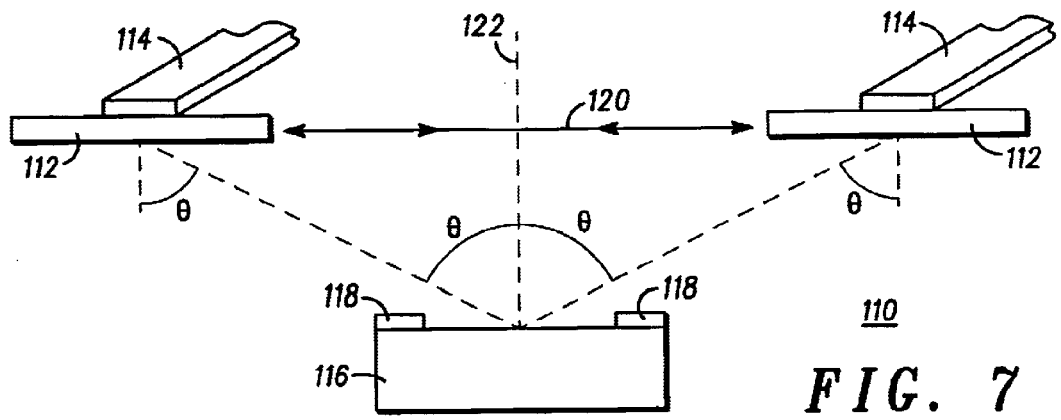
FIG. 7 is a side view of the physical vapor deposition system used to deposit material layers in accordance with the present invention.

Turn now to FIG. 7 which illustrates a side view of physical vapor deposition system 110. Substrate 112 is positioned at the angle, θ, relative to a reference line 122 by robot arm 114, as illustrated. A plasma (not shown) is adjacent to target 116 while substrate 112 is moved along a reference line 120 by arm 114. When the target is biased with a voltage the plasma sputters the target material into a wide distribution of angles. Thus, at the beginning of the substrate sweep, when the substrate is off to one side of the target, the depositing atoms are predominantly from an oblique angle. The sweep range and velocity of the substrate can be controlled to determine how much of the layer is deposited under oblique conditions. One advantage of this method of deposition is that the deposited film is more uniform while still obtaining an obliquely deposited film with an induced magnetic anisotropy from a nonzero deposition angle θ at the beginning of the layer deposition pass and at the end. The shapers 118 are designed to provide a film of uniform thickness over the substrate 112 for the desired sweep range and velocity profile. This method can be used to produce layers having a well-defined anisotropy direction even when no magnetic field is applied during deposition of the layer.

Thus, a new and improved method of depositing a material layer for magnetoelectronic devices, such as MRAM devices including MTJ and/or GMR devices, magnetic sensors, etc., which utilize a ferromagnetic layer has been disclosed. The method involves depositing portions of the magnetic device at a nonzero deposition angle. An advantage of this deposition method is that the induced magnetic anisotropy is substantially more stable with temperature. Another advantage is that the range of values for the magnitude of the induced anisotropy is increased. Still another advantage is that the new and improved deposition method produces a well-defined anisotropy axis without need for an applied magnetic field during deposition. Although it will be understood that an applied magnetic field can be used if desired. Further, the nonzero deposition angle can be chosen to supplement or oppose the shape anisotropy, the pair ordering anisotropy, or the intrinsic anisotropy. Also, a sufficiently large induced anisotropy can be used in creating a fixed layer, if desired, so that the antiferromagnetic pinning layer 32 is not needed.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

What is claimed is:

1. A method of fabricating a magnetoelectronic device, the method comprising the steps of:
   depositing at least one magnetic region having an induced magnetic anisotropy with a resultant magnetic moment vector, a magnitude, and a direction, wherein the induced magnetic anisotropy is created by depositing at least a portion of the at least one magnetic region at a nonzero deposition angle relative to a reference line oriented perpendicular to a surface of the magnetoelectronic device.

2. A method as claimed in claim 1 including in addition the step of depositing the at least one magnetic region using one of an ion beam deposition system and a physical vapor deposition system with a sputtering target wherein a substrate is swept over the sputtering target.

3. A method as claimed in claim 1 wherein the at least one magnetic region includes an electrically insulating material layer sandwiched therebetween a first ferromagnetic layer and a second ferromagnetic layer and wherein the electrically insulating material layer forms a tunneling junction.

4. A method as claimed in claim 3 wherein the at least one magnetic region includes at least one layer of an anti-ferromagnetic coupling material.

5. A method as claimed in claim 4 wherein the portion of the at least one magnetic region deposited at the nonzero deposition angle is one of the first ferromagnetic layer, the second ferromagnetic layer, the electrically insulating material layer, the at least one layer of the anti-ferromagnetic coupling material, and combinations thereof.

6. A method as claimed in claim 1 wherein the at least one magnetic region is sandwiched therebetween a first conductive line and a second conductive line.

7. A method as claimed in claim 1 wherein the nonzero deposition angle is chosen so that the direction of the induced magnetic anisotropy is oriented substantially perpendicular to a deposition plane of incidence.

8. A method as claimed in claim 1 wherein the nonzero deposition angle is chosen so that the direction of the induced magnetic anisotropy is oriented substantially parallel to a deposition plane of incidence.

9. A method as claimed in claim 6 wherein the portion of the at least one magnetic region deposited at the nonzero deposition angle is a seed layer deposited adjacent to at least one of the first and second conductive lines.

10. A method as claimed in claim 9 wherein the subsequent layers deposited on the seed layer are deposited at a substantially zero deposition angle relative to the reference line.

11. A method as claimed in claim 1 wherein the nonzero deposition angle is chosen to supplement or oppose at least one of a shape anisotropy, a pair ordering anisotropy, and an intrinsic anisotropy of at least one of the first and second magnetic regions.

12. A method of fabricating a magnetoresistive tunneling junction device with a switching field, the method comprising the steps of:
    providing a substrate with a surface;
    depositing a first magnetic region having a resultant magnetic moment vector with a magnitude fixed in a preferred direction in the absence of an applied magnetic field onto the substrate wherein the first magnetic region has a thickness and a first induced magnetic anisotropy;
    depositing an electrically insulating material onto the first magnetic region to form a magnetoresistive tunneling junction; and
    depositing a second magnetic region onto the electrically insulating material, the second magnetic region having a second induced magnetic anisotropy and a resultant magnetic moment vector with a magnitude oriented in a position parallel or anti-parallel to the preferred direction of the first magnetic region wherein at least a portion of one of the first and second magnetic regions is deposited at a nonzero deposition angle relative to a reference line oriented substantially perpendicular to the surface of the substrate.

13. A method as claimed in claim 12 wherein at least one of the first and second magnetic regions include a synthetic anti-ferromagnetic material layer that has an adjustable magnetic switching volume wherein the synthetic anti-ferromagnetic layer material includes N ferromagnetic layers which are anti-ferromagnetically coupled, where N is a whole number greater than or equal to two.

14. A method as claimed in claim 12 wherein the nonzero deposition angle is chosen to obtain the switching field.

15. A method as claimed in claim 13 wherein each N ferromagnetic layer is anti-ferromagnetically coupled by sandwiching a layer of an anti-ferromagnetic coupling material between each adjacent ferromagnetic layer.

16. A method as claimed in claim 12 wherein the nonzero deposition angle is chosen so that at least one of the first and second induced magnetic anisotropies is oriented substantially perpendicular to a deposition plane of incidence.

17. A method as claimed in claim 12 wherein the nonzero deposition angle is chosen so that at least one of the first and second induced magnetic anisotropies is oriented substantially parallel to a deposition plane of incidence.

18. A method as claimed in claim 12 wherein the nonzero deposition angle is chosen to supplement or oppose at least one of a shape anisotropy, a pair ordering anisotropy, and an intrinsic anisotropy of at least one of the first and second magnetic regions.

19. A method as claimed in claim 12 wherein the portion of the at least one of the first and second magnetic regions deposited at the nonzero deposition angle is a seed layer.

20. A method as claimed in claim 19 wherein the subsequent layers deposited on the seed layer are deposited at a substantially zero deposition angle relative to the reference line.

21. A method as claimed in claim 12 wherein the steps of depositing the first and second magnetic regions comprises using one of an ion beam deposition system and a physical vapor deposition system with a sputtering target wherein a substrate is swept over the sputtering target.

22. A method as claimed in claim 12 wherein each of the first and second magnetic regions is sandwiched between a first conductive line and a second conductive line.

23. A magnetoelectronic device comprising: at least one magnetic region having an induced magnetic anisotropy with a magnitude and a direction wherein the induced magnetic anisotropy is created by depositing at least a portion of the at least one magnetic region at a nonzero deposition angle relative to a reference line oriented substantially perpendicular to a surface of that region.

24. A magnetoelectronic device as claimed in claim 23 wherein the depositing of the at least one magnetic region comprises using one of an ion beam deposition system and a physical vapor deposition system with a sputtering target wherein a substrate is swept over the sputtering target.

25. A magnetoelectronic device as claimed in claim 23 wherein the at least one magnetic region includes an electrically insulating material layer sandwiched therebetween a first ferromagnetic layer and a second ferromagnetic layer and wherein the electrically insulating material layer forms a tunneling junction.

26. A magnetoelectronic device as claimed in claim 25 wherein the at least one magnetic region includes at least one layer of an anti-ferromagnetic coupling material.

27. A magnetoelectronic device as claimed in claim 26 wherein the portion of the at least one magnetic region deposited at the nonzero deposition angle is one of the first ferromagnetic layer, the second ferromagnetic layer, the electrically insulating material layer, the at least one layer of the anti-ferromagnetic coupling material, and combinations thereof.

28. A magnetoelectronic device as claimed in claim 23 wherein the nonzero deposition angle is chosen so that the direction of the induced magnetic anisotropy is oriented substantially perpendicular to a deposition plane of incidence.

29. A magnetoelectronic device as claimed in claim 23 wherein the nonzero deposition angle is chosen so that the direction of the induced magnetic anisotropy is oriented substantially parallel to a deposition plane of incidence.

30. A magnetoelectronic device as claimed in claim 23 wherein the portion of the at least one magnetic region deposited at the nonzero deposition angle is a seed layer deposited adjacent to at least one of the first and second conductive lines.

31. A magnetoelectronic device as claimed in claim 30 wherein the subsequent layers deposited on the seed layer are deposited at a substantially zero deposition angle relative to the reference line.

32. A magnetoelectronic device as claimed in claim 23 wherein the at least one magnetic region includes a fixed magnetic region.

33. A magnetoelectronic device as claimed in claim 23 wherein the at least one magnetic region includes a free magnetic region.

34. A magnetoresistive tunneling junction device with a switching field, comprising:
a substrate with a surface;
at least one magnetic region positioned on the substrate, the at least one magnetic region having an induced magnetic anisotropy with a magnitude and a direction; and
wherein the induced magnetic anisotropy is created by depositing at least a portion of the at least one magnetic region at a nonzero deposition angle relative to a reference line oriented substantially perpendicular to the surface of the substrate.

35. An apparatus as claimed in claim 34 wherein the at least one magnetic region is deposited using one of an ion beam deposition system and a physical vapor deposition system with a sputtering target wherein the substrate is swept over the sputtering target.

36. An apparatus as claimed in claim 34 wherein the at least one magnetic region includes an electrically insulating material layer sandwiched therebetween a first ferromagnetic layer and a second ferromagnetic layer wherein the electrically insulating material layer forms a tunneling junction.

37. An apparatus as claimed in claim 36 wherein the at least one magnetic region includes at least one layer of an anti-ferromagnetic coupling material.

38. An apparatus as claimed in claim 34 wherein the nonzero deposition angle is chosen so that a direction of the induced magnetic anisotropy is substantially perpendicular to a deposition plane of incidence.

39. An apparatus as claimed in claim 34 wherein the nonzero deposition angle is chosen so that a direction of the induced magnetic anisotropy is substantially parallel to a deposition plane of incidence.

40. An apparatus as claimed in claim 38 wherein the portion of the at least one magnetic region deposited at a nonzero deposition angle is a seed layer deposited adjacent to at least one of first and second conductive lines sandwiched around the at least one magnetic region.

41. An apparatus as claimed in claim 40 wherein the subsequent layers deposited on the seed layer are deposited at a substantially zero deposition angle relative to the reference line.

42. An apparatus as claimed in claim 34 wherein the magnetoresistive tunneling junction device includes a magnetoresistive random access memory device.

43. An apparatus as claimed in claim 38 wherein at least one of the first and second magnetic regions include a synthetic anti-ferromagnetic material layer that has an adjustable magnetic switching volume wherein the synthetic anti-ferromagnetic layer material includes N ferromagnetic layers which are anti-ferromagnetically coupled, where N is a whole number greater than or equal to two.

44. An apparatus as claimed in claim 34 wherein the nonzero deposition angle is chosen to obtain the switching field.

45. An apparatus as claimed in claim 43 wherein each N ferromagnetic layer is anti-ferromagnetically coupled by sandwiching a layer of an anti-ferromagnetic coupling material between each adjacent ferromagnetic layer.

46. An apparatus as claimed in claim 34 wherein the nonzero deposition angle is chosen to supplement or oppose at least one of a shape anisotropy, a pair ordering anisotropy, and an intrinsic anisotropy of at least one of the first and second magnetic regions.

47. A magnetoelectronic device as claimed in claim 34 wherein the at least one magnetic region includes a fixed magnetic region.

48. A magnetoelectronic device as claimed in claim 34 wherein the at least one magnetic region includes a free magnetic region.

* * * * *